United States Patent
Suzuki et al.

(10) Patent No.: US 8,542,345 B2
(45) Date of Patent: Sep. 24, 2013

(54) MEASUREMENT APPARATUS, EXPOSURE APPARATUS, AND DEVICE MANUFACTURING METHOD TO MEASURE NUMERICAL APERTURE OF THE OPTICAL SYSTEM USING INTERFERENCE FRINGE

(75) Inventors: Takeshi Suzuki, Utsunomiya (JP); Yoshiyuki Kuramoto, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 664 days.

(21) Appl. No.: 12/560,024

(22) Filed: Sep. 15, 2009

(65) Prior Publication Data
US 2010/0068634 A1    Mar. 18, 2010

(30) Foreign Application Priority Data
Sep. 17, 2008    (JP) ................................. 2008-238388

(51) Int. Cl.
*G03B 27/54*    (2006.01)
(52) U.S. Cl.
USPC .......................................................... 355/67
(58) Field of Classification Search
USPC ..................................... 355/67, 53; 356/521
See application file for complete search history.

(56) References Cited

U.S. PATENT DOCUMENTS
7,095,509 B2 *    8/2006    Kakuchi ........................ 356/515
7,499,179 B2     3/2009    Shiode

FOREIGN PATENT DOCUMENTS
JP    2002-005787 A    1/2002

* cited by examiner

*Primary Examiner* — Toan Ton
*Assistant Examiner* — Chia-how Michael Liu
(74) *Attorney, Agent, or Firm* — Canon U.S.A., Inc., IP Division

(57) ABSTRACT

A measurement apparatus comprises a mirror configured to reflect test light which passes through an optical system, an interferometer unit which includes an image sensor and is configured to form an interference fringe on an image sensing plane of the image sensor by reference light and the test light reflected by the mirror, and a controller configured to control the interferometer unit, and to compute a numerical aperture of the optical system based on the interference fringe captured by the image sensor, wherein the controller is configured to compute a numerical aperture NA of the optical system by multiplying a quotient $\Delta NA/\Delta R$, describing a change $\Delta NA$ in numerical aperture NA of the optical system with respect to a change $\Delta R$ in pupil radius R of the optical system in the image sensing plane, by the pupil radius R of the optical system in the image sensing plane.

5 Claims, 3 Drawing Sheets

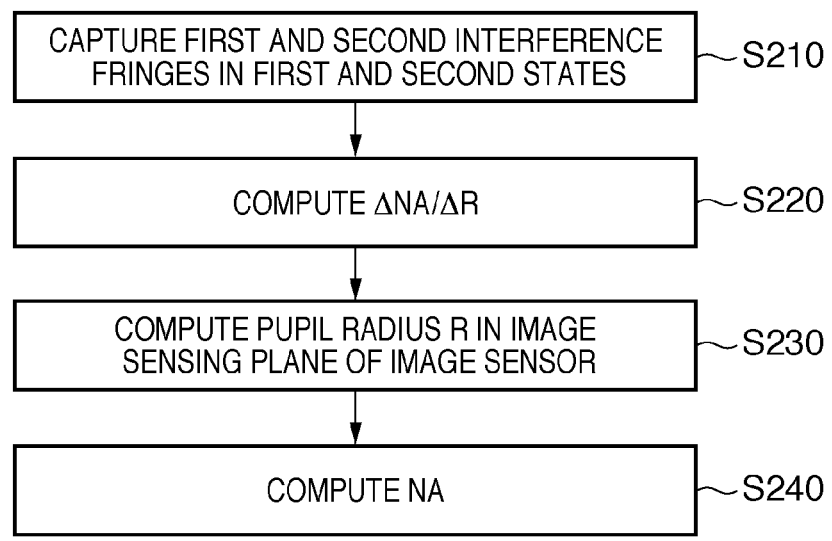
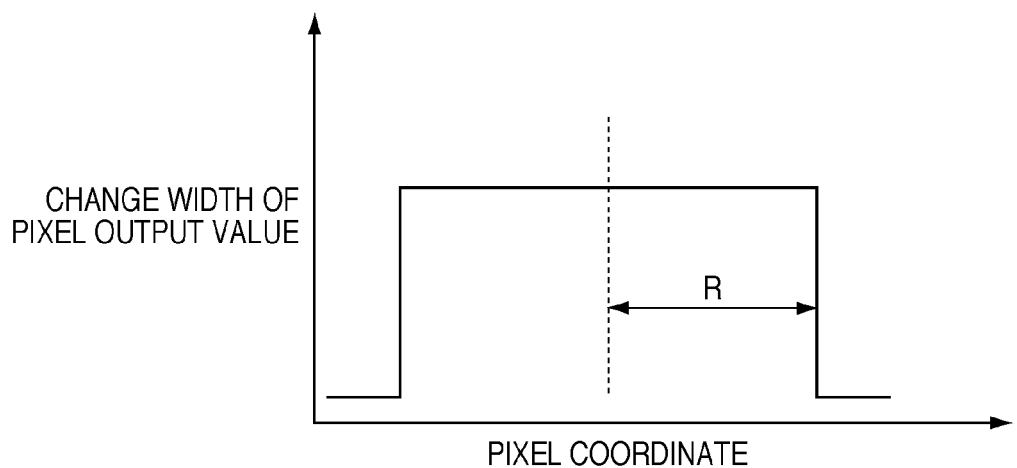

US 8,542,345 B2

MEASUREMENT APPARATUS, EXPOSURE APPARATUS, AND DEVICE MANUFACTURING METHOD TO MEASURE NUMERICAL APERTURE OF THE OPTICAL SYSTEM USING INTERFERENCE FRINGE

BACKGROUND OF THE INVENTION

1. Field of the Invention

The present invention relates to a measurement apparatus which measures the numerical aperture of an optical system to be measured, an exposure apparatus including the measurement apparatus, and a method of manufacturing a device using the exposure apparatus.

2. Description of the Related Art

An exposure apparatus for manufacturing devices such as semiconductor devices illuminates an original, on which a pattern is formed, with light to project the pattern of the original onto a substrate by a projection optical system. With this operation, the pattern of the original is transferred onto the photosensitive agent on the substrate. The resolution of the projection optical system depends on the numerical aperture (NA) of the projection optical system; the resolution improves as the numerical aperture increases. In view of this, the numerical aperture of the projection optical system is an important index indicating the performance of the projection optical system.

To calculate the numerical aperture of the projection optical system, one known method calculates a resolution RP of the projection optical system and computes the numerical aperture based on a relation RP=λ/NA (Japanese Patent Laid-Open No. 2002-5787). This method calculates the resolution RP by transferring various patterns having different line widths onto a substrate via the projection optical system, and measuring, by a measurement apparatus such as an SEM, the pattern thus formed on the substrate. Unfortunately, it is difficult to precisely calculate the numerical aperture because the resolution RP also depends on the properties of the photosensitive agent (photoresist) and the aberration of the projection optical system.

SUMMARY OF THE INVENTION

The present invention provides a technique advantageous to more precisely calculate the numerical aperture of an optical system to be measured.

One of the aspect of the present invention provides a measurement apparatus which measures a numerical aperture of an optical system to be measured, the measurement apparatus comprising a mirror configured to reflect test light which passes through the optical system, an interferometer unit which includes an image sensor and is configured to form an interference fringe on an image sensing plane of the image sensor by reference light and the test light reflected by the mirror, and a controller configured to control the interferometer unit, and to compute a numerical aperture of the optical system based on the interference fringe captured by the image sensor, wherein the controller is configured to compute a numerical aperture NA of the optical system by multiplying a quotient $\Delta NA/\Delta R$, describing a change $\Delta NA$ in numerical aperture NA of the optical system with respect to a change $\Delta R$ in pupil radius R of the optical system in the image sensing plane, by the pupil radius R of the optical system in the image sensing plane.

Further features of the present invention are made apparent from the following description of exemplary embodiments with reference to the attached drawings.

BRIEF DESCRIPTION OF THE DRAWINGS

FIG. 2 is a flowchart showing the sequence of an operation for measuring the numerical aperture (NA) of an optical system to be measured;

FIG. 3 is a graph illustrating the change width of the output (pixel value) from each pixel of an image sensor upon fringe scanning.

DESCRIPTION OF THE EMBODIMENTS

Various embodiments of the present invention will be described below with reference to the accompanying drawings.

Figure 1:
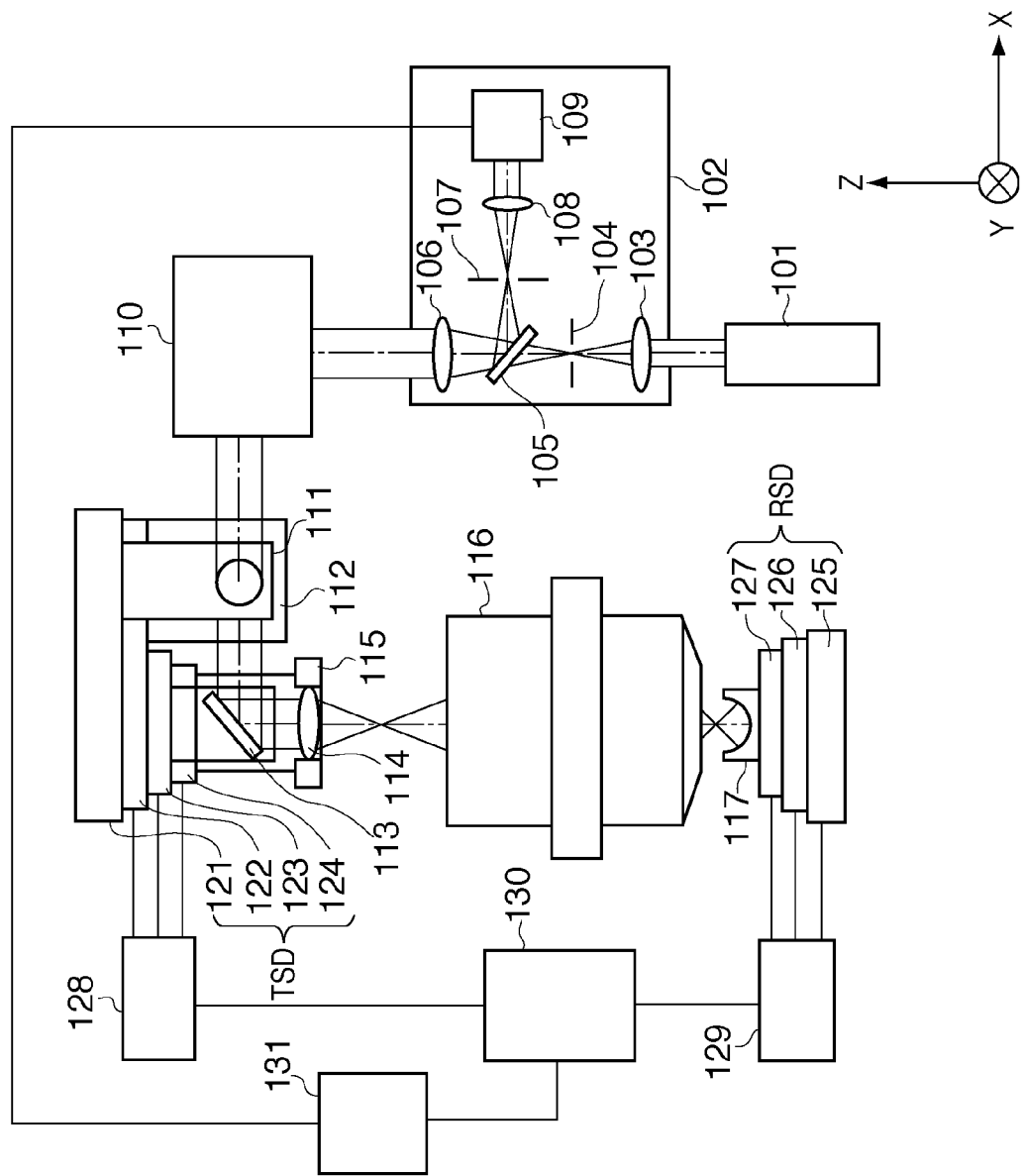
FIG. 1 is a view showing the schematic arrangement of a measurement apparatus according to a first embodiment of the present invention.

FIG. 1 is a view showing the schematic arrangement of a measurement apparatus according to a first embodiment of the present invention. Although the measurement apparatus according to the first embodiment includes a Fizeau interferometer as an interferometer for measuring the wavefront aberration of an optical system to be measured (e.g., a projection optical system of an exposure apparatus), it may include an interferometer of another scheme. The arrangement and operation of the measurement apparatus according to the first embodiment of the present invention will now be explained with reference to FIG. 1.

Light from a light source (e.g., a laser light source) 101 which emits light, having high coherence and an oscillation wavelength close to the wavelength of light for use in an optical system 116 to be measured, is guided to an interferometer unit 102. Inside the interferometer unit 102, a condenser lens 103 converges the light on a spatial filter 104. The diameter of the spatial filter 104 can be set to about ½ that of an Airy disk, which is determined depending on the numerical aperture (NA) of a collimator lens 106. With this setting, the light emerging from the spatial filter 104 turns into an ideal spherical wave. The resultant light is transmitted through a half mirror 105, converted into collimated light by the collimator lens 106, and output from the interferometer unit 102.

The light emerging from the interferometer unit 102 strikes a TS (transmissive sphere) 114 via mirrors 111, 112, and 113 of a light extension optical system 110. At this time, a TS driving mechanism TSD controls the position of the TS 114 in the X, Y, and Z directions. The TS driving mechanism TSD includes a Z stage 124, X stage 123, and Y stage 122 for driving the TS 114 in the Z, X, and Y directions, respectively, and a stage base plate 121. The mirror 111 is fixed on the stage base plate 121. The mirror 112 is fixed on the Y stage 122 and moves in the Y direction. The mirror 113 is fixed on the X stage 123 and moves in the X direction.

The light which strikes the TS 114 and is reflected by a Fizeau surface as the final surface of the TS 114 serves as reference light. The reference light travels back to the interferometer unit 102 via the TS 114, the mirrors 113, 112, and 111, and the light extension optical system 110.

The light transmitted through the TS 114 serves as test light. The test light forms an image on the object plane of the optical system 116, enters and passes through the optical system 116, and forms an image again on the image plane of the optical system 116. The test light is reflected by an RS (reflective sphere) 117, and travels back to the interferometer unit 102 via the optical system 116, the TS (transmissive sphere) 114, the mirrors 113, 112, and 111, and the light extension optical system 110. The RS (reflective sphere) 117 exemplifies a mirror which reflects the test light having passed through the optical system 116.

An RS driving mechanism RSD controls the position of the RS 117 in the X, Y, and Z directions. The RS driving mechanism RSD includes a Z stage 127, X stage 126, and Y stage 125 for driving the RS 117 in the Z, X, and Y directions, respectively. The RS driving mechanism RSD can position the RS 117 at an arbitrary image height position in the optical system 116.

The light beams having traveled back to the interferometer unit 102 in the form of reference light and test light are transmitted through the collimator lens 106, reflected by the half mirror 105, and converged on a spatial filter 107. The spatial filter 107 serves to shield any stray light and steep wavefronts. The reference light and test light having passed through the spatial filter 107 are guided to the image sensing plane of an image sensor 109 by an imaging lens 108 as nearly collimated light beams. An interference fringe is formed on the image sensing plane of the image sensor 109 by superposition of the reference light and the test light.

A high-precision position measurement device such as a laser length measurement device measures the positions of the X stage 123, Y stage 122, and Z stage 124 which constitute the TS driving mechanism TSD (these positions indirectly indicate the X, Y, and Z positions of the TS 114), and the positions of the X stage 126, Y stage 125, and Z stage 127 which constitute the RS driving mechanism RSD (these positions indirectly indicate the X, Y, and Z positions of the RS 117). Based on the measurement results obtained by the position measurement device, a TS driving controller 128 which controls the TS driving mechanism TSD, and an RS driving controller 129 which controls the RS driving mechanism RSD control the positions of the TS 114 and RS 117, respectively, with high accuracy under the control of a position controller 130.

The position controller 130 can move the TS 114 and the RS 117 to an arbitrary image height position in the optical system 116 by controlling the TS driving controller 128 and the RS driving controller 129 based on a command from a main controller 131. This makes it possible to measure the wavefront aberration of the optical system 116 at an arbitrary image height position in the optical system 116.

The interference fringe captured by the image sensor 109 is transferred to the main controller 131. The wavefront of the optical system 116 is computed based on a plurality of interference fringes captured in accordance with the fringe scanning method.

The principle of a method of measuring the numerical aperture (NA) of the optical system 116 will now be explained. First, the image sensor 109 captures a first interference fringe formed on the image sensing plane of the image sensor 109 in a first state that is the position of the RS 117, serving as a mirror which reflects the test light having passed through the optical system 116, relative to the optical system 116. Next, the position of the RS 117 relative to the optical system 116 is changed from the first state to a second state, and the image sensor 109 captures a second interference fringe formed on the image sensing plane of the image sensor 109 in the second state.

More specifically, the first state can be, for example, a state in which an interference fringe in a null state (a state in which there is no interference fringe accounted for by alignment of the RS 117 with respect to the optical system 116) is formed as a first interference fringe. The second state can be, for example, a state in which a tilt fringe is formed as a second interference fringe. The change from the first state to the second state can be performed by, for example, moving the RS 117 by $\Delta X$ in the X direction along the image plane of the optical system 116. Alternatively, the change from the first state to the second state can be performed by, for example, moving the RS 117 by $\Delta Y$ in the Y direction along the image plane of the optical system 116. A case in which the change from the first state to the second state is performed by moving the RS 117 by $\Delta X$ in the X direction along the image plane of the optical system 116 will be exemplified hereinafter. Note that $\Delta X$ can be interpreted as a variable representing the amount of movement of the RS 117 between the first state and the second state.

A first radius R1 is set to an arbitrary value as the pupil radius of the optical system 116 in the image sensing plane of the image sensor 109. A wavefront difference W1 is then computed. The wavefront difference W1 is the difference between the wavefront of the optical system 116 computed based on a first interference fringe formed in the first state using the first radius R1, and the wavefront of the optical system 116 computed based on a second interference fringe formed in the second state using the first radius R1. Also, a second radius R2 (R1≠R2) is set to an arbitrary value as the pupil radius of the optical system 116 in the image sensing plane of the image sensor 109. A wavefront difference W2 is then computed. The wavefront difference W2 is the difference between the wavefront of the optical system 116 computed based on a first interference fringe formed in the first state using the second radius R2, and the wavefront of the optical system 116 computed based on a second interference fringe formed in the second state using the second radius R2. Note that the first radius R1 and the second radius R2 can be arbitrarily set for wavefront computation, as described above.

Assume that a change in pupil radius R of the optical system 116 in the image sensing plane of the image sensor 109 is $\Delta R$ (=R1−R2), and a change in wavefront difference is $\Delta W$ (=W1−W2) herein. The change $\Delta W$ in wavefront difference with respect to the change $\Delta R$ in pupil radius R of the optical system 116 in the image sensing plane, for use in wavefront computation, is given by:

$$\Delta W/\Delta R = (W1 - W2)/(R1 - R2) \tag{1}$$

A wavefront difference W generated upon moving the RS 117 by $\Delta X$ is given by:

$$W = NA \cdot \Delta X \tag{2}$$

where NA is the numerical aperture of the optical system 116.

Equation (2) can be rewritten to describe the NA as:

$$NA = W/\Delta X \tag{3}$$

From equation (3), a quotient $\Delta NA/\Delta R$ describing a change $\Delta NA$ in numerical aperture NA with respect to a change $\Delta R$ in pupil radius R of the optical system 116 in the image sensing plane of the image sensor 109 is given by:

$$\Delta NA/\Delta R = (\Delta W/\Delta R)/\Delta X = (W1 - W2)/\{(R1 - R2) \cdot \Delta X\} \tag{4}$$

Hence, based on the quotient $\Delta W/\Delta R$ calculated in accordance with equation (1) and the amount of movement $\Delta X$ of the RS 117, the quotient $\Delta NA/\Delta R$ describing the change $\Delta NA$ in numerical aperture NA with respect to the change $\Delta R$ in pupil radius R of the optical system 116 in the image sensing plane of the image sensor 109 can be calculated in accordance with equation (4).

FIG. 3 is a graph illustrating the change width of the output (pixel value) from each pixel of the image sensor 109 upon fringe scanning. The abscissa indicates the position (pixel coordinate) in the image sensing plane of the image sensor 109. A light incidence region in the image sensing plane of the image sensor 109 (i.e., a region where an interference fringe is formed) is the pupil region of the optical system 116 in the image sensing plane of the image sensor 109. Using the radius R of this region, the numerical aperture NA of the optical system 116 can be calculated in accordance with:

$$NA = (\Delta NA/\Delta R) \times R \quad (5)$$

An operation for measuring the numerical aperture (NA) of the optical system 116 will now be explained with reference to the flowchart shown in FIG. 2. The main controller (controller) 131 controls this operation.

In step S210, the main controller 131 controls the RS driving mechanism RSD so that the position of the RS 117 relative to the optical system 116 becomes the first state, and acquires data on a first interference fringe formed on the image sensing plane of the image sensor 109. The main controller 131 also controls the RS driving mechanism RSD so that the position of the RS 117 relative to the optical system 116 becomes the second state, and acquires data on a second interference fringe formed on the image sensing plane of the image sensor 109.

In step S220, based on radii R1 and R2, wavefront differences W1 and W2, and an amount of movement ΔX, a quotient ΔNA/ΔR is computed in accordance with equation (4). The wavefront difference W1 is the difference between the wavefront of the optical system 116 computed based on a first interference fringe using the first radius R1, and the wavefront of the optical system 116 computed based on a second interference fringe using the first radius R1. The wavefront difference W2 is the difference between the wavefront of the optical system 116 computed based on a first interference fringe using the second radius R2, and the wavefront of the optical system 116 computed based on a second interference fringe using the second radius R2.

In step S230, the main controller 131 computes a pupil radius R of the optical system 116 in the image sensing plane of the image sensor 109 using at least one of the first interference fringe or the second interference fringe, or using another interference fringe captured by the image sensor 109.

In step S240, the main controller 131 computes a numerical aperture NA of the optical system 116 by multiplying the quotient ΔNA/ΔR by the pupil radius R of the optical system 116 in the image sensing plane of the image sensor 109, as shown in equation (5).

A method of calculating the numerical aperture of the optical system 116 based on a null fringe and a tilt fringe has been exemplified in the above-mentioned embodiment. However, according to the principle of the present invention, it is possible to calculate the numerical aperture of the optical system 116 based on interference fringes obtained in at least two states different in the alignment state (positional relationship) of the RS 117 with respect to the optical system 116. Since the quotient ΔNA/ΔR is determined depending on the arrangement of an interferometer, it does not need to be calculated for each measurement of the numerical aperture of the optical system.

Figure 4:
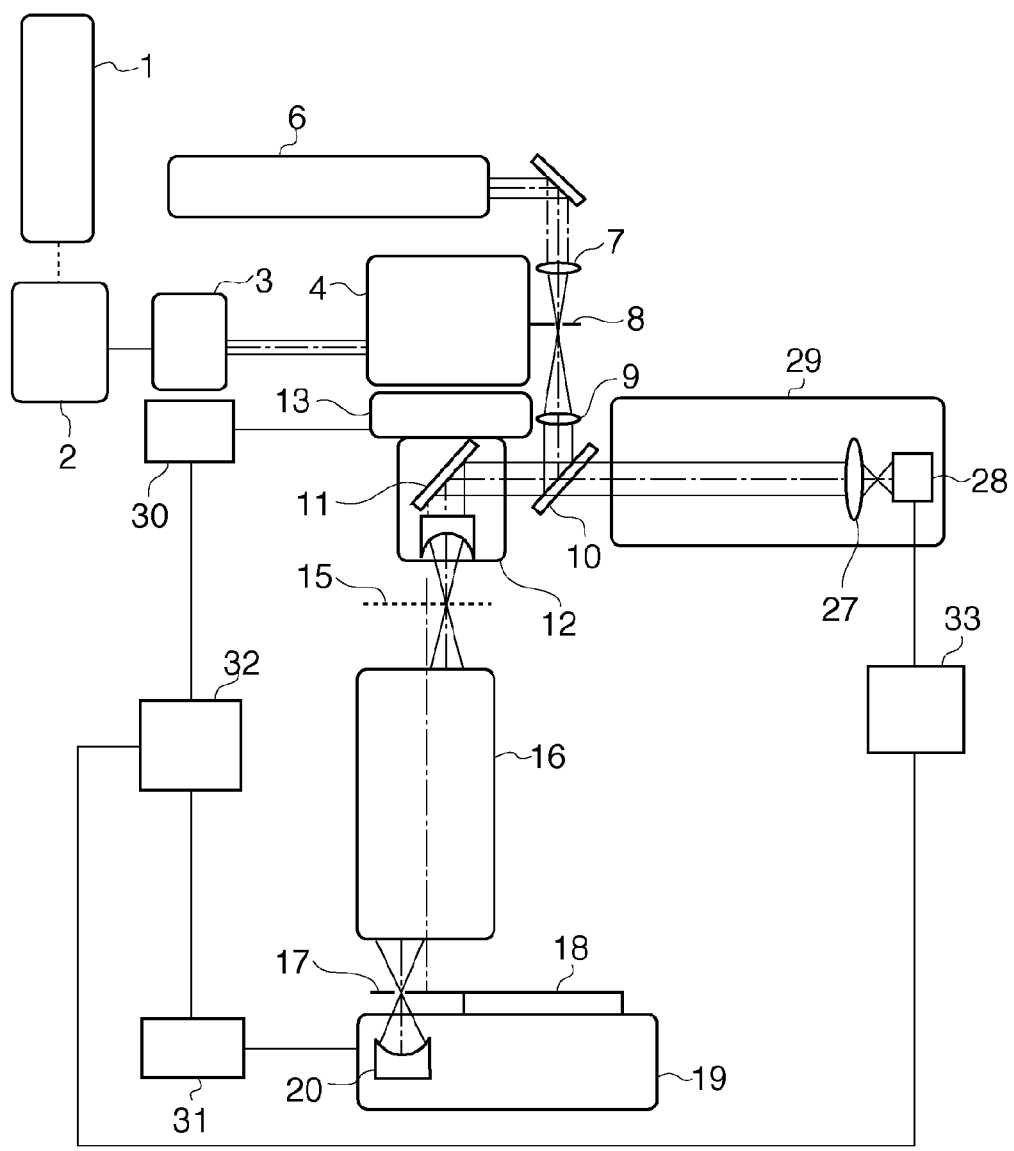
FIG. 4 is a view showing the schematic arrangement of an exposure apparatus according to a second embodiment of the present invention.

FIG. 4 is a view showing the schematic arrangement of an exposure apparatus according to a second embodiment of the present invention. This exposure apparatus includes a projection optical system which projects the pattern of an original onto a substrate, and a measurement apparatus which measures the numerical aperture of the projection optical system as an optical system to be measured. The principle, operation, and arrangement of this measurement apparatus can be the same as in the first embodiment.

Referring to FIG. 4, a light beam emitted by a light source 1 such as an excimer laser (an ArF excimer laser or a KrF excimer laser) is converted into one having a beam shape symmetrical about the optical axis by a beam shaping optical system 2, and is guided to a light path switching mirror 3 in measuring a projection optical system 16. The light path switching mirror 3 is retracted outside the light path during substrate exposure. The light beam emerging from the beam shaping optical system 2 enters an incoherence unit 4 in substrate exposure and is reduced in coherence. After that, the light beam passes through an illumination optical system and illuminates an original 15. The projection optical system 16 serves as both an optical system which projects the pattern of the original 15 onto a substrate 18, and a measurement target (an optical system to be measured) for the measurement apparatus.

The arrangement of the measurement apparatus will now be explained. In measuring the projection optical system 16, the light beam from the beam shaping optical system 2 is reflected by the light path switching mirror 3, and guided, by a light extension optical system 6, to the vicinity of an interferometer unit 29 located near the location plane of the original 15. The light beam emerging from the light extension optical system 6 is converged on one point by a condenser lens 7. A pinhole 8 has been formed near the focal plane of the condenser lens 7. The light beam having passed through the pinhole 8 is converted into collimated light by a collimator lens 9. The diameter of the pinhole 8 has been set nearly equal to that of an Airy disk, which is determined depending on the numerical aperture of the collimator lens 9. As a consequence, the light beam emerging from the pinhole 8 is a nearly ideal spherical wave.

The collimated light from the collimator lens 9 is reflected by a half mirror 10 and guided to a TS (transmissive sphere) 12 via a plane mirror 11 located on an X-Y-Z stage mechanism 13. The TS 12 corresponds to the foregoing TS 114.

At this time, the TS 12 can be inserted into and retracted from the light path by moving the X-Y-Z stage mechanism 13. The X-Y-Z stage mechanism 13 can function as the foregoing TS driving mechanism TSD.

An RS 20 is located on an X-Y-Z stage mechanism 19 serving as a substrate stage mechanism which holds the substrate 18. The RS 20 corresponds to the foregoing RS 117. The center of curvature of the RS 20 lies in a plane flush with the surface of the substrate 18. The light beam from the projection optical system 16 is reflected by the RS 20, passes through the projection optical system 16 and the TS 12 while tracing back along roughly the same light path it has traversed, is transmitted through the half mirror 10 of the interferometer via the plane mirror 11, and enters the interferometer unit 29. The interferometer unit 29 corresponds to the foregoing interferometer unit 102. The interferometer unit 29 includes a lens 27 and an image sensor 28 as same as the interferometer unit 102.

A driving controller 30 which controls the X-Y-Z stage mechanism 13, and a driving controller 31 which controls the X-Y-Z stage mechanism 19 control the positions of the TS 12 and the RS 20, respectively, with high accuracy under the control of a position controller 32. A main controller (controller) 33 controls the X-Y-Z stage mechanism 13 and the X-Y-Z stage mechanism 19 through the position controller 32, and controls the interferometer unit 29. The main controller (controller) 33 not only controls a substrate exposure operation but also performs a process for measuring the numerical aperture of the projection optical system 16 as an optical system to be measured. Details of the measurement controlled by the main controller 33 are the same as in the main controller 131 of the first embodiment.

A device manufacturing method according to another embodiment of the present invention is suitable for manufacturing, for example, a semiconductor device and a liquid crystal device. This method includes, for example, a step of transferring the pattern of an original onto a photosensitive agent applied on a substrate using the above-mentioned exposure apparatus, and a step of developing the photosensitive agent. The devices are further processed by, for example, known subsequent steps (e.g., etching, resist removal, dicing, bonding, and packaging).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-238388, filed Sep. 17, 2008, which is hereby incorporated by reference herein in its entirety.

What is claimed is:

1. A measurement apparatus which measures a numerical aperture NA of an optical system to be measured, the measurement apparatus comprising:
   a mirror configured to reflect test light which passes through the optical system; an interferometer unit which includes an image sensor and is configured to form an interference fringe on an image sensing plane of the image sensor by reference light and the test light reflected by the mirror; and
   a controller configured to control the interferometer unit, and to compute the numerical aperture NA of the optical system based on the interference fringe captured by the image sensor,
   wherein the controller is configured to compute the numerical aperture NA of the optical system by multiplying a quotient $\Delta NA/\Delta R$, describing a change $\Delta NA$ in the numerical aperture NA of the optical system with respect to a change $\Delta R$ in pupil radius R of the optical system in the image sensing plane, by the pupil radius R of the optical system in the image sensing plane,
   wherein the controller is configured to compute, using a first radius R1 as the pupil radius R of the optical system in the image sensing plane, a wavefront difference W1 that is a difference between a first wavefront of the optical system computed based on a first interference fringe formed on the image sensing plane when a position of the mirror relative to the optical system is in a first state and a second wavefront of the optical system computed based on a second interference fringe formed on the image sensing plane when the position of the mirror relative to the optical system is in a second state which is obtained by a movement of a movement amount $\Delta X$ from the position of the first state,
   to compute, using a second radius R2 that differs from the first radius R1 as the pupil radius R of the optical system in the image sensing plane, a wavefront difference W2 that is a difference between a third wavefront of the optical system computed based on the first interference fringe, and a fourth wavefront of the optical system computed based on the second interference fringe, and
   to compute the quotient $\Delta NA/\Delta R$ using the following equation:

$$\Delta NA/\Delta R = (W1-W2)/\{(R1-R2)\Delta X\}.$$

2. The measurement apparatus according to claim 1, further comprising
   a driving mechanism configured to drive the mirror,
   wherein the controller is configured to control the driving mechanism so that a position of the mirror relative to the optical system becomes the position in the first state and the position in the second state.

3. The measurement apparatus according to claim 1, wherein the controller computes the pupil radius R of the optical system in the image sensing plane using the first interference fringe and the second interference fringe.

4. An exposure apparatus which projects a pattern of an original onto a substrate using a projection optical system to expose the substrate, the exposure apparatus comprising:
   a mirror configured to reflect test light which passes through the projection optical system;
   an interferometer unit which includes an image sensor and is configured to form an interference fringe on an image sensing plane of the image sensor by reference light and the test light reflected by the mirror; and
   a controller configured to control the interferometer unit, and compute a numerical aperture NA of the projection optical system based on the interference fringe captured by the image sensor,
   wherein the controller computes the numerical aperture NA of the projection optical system by multiplying a quotient $\Delta NA/\Delta R$ describing a change $\Delta NA$ in the numerical aperture NA of the projection optical system with respect to a change $\Delta R$ in pupil radius R of the projection optical system in the image sensing plane by the pupil radius R of the projection optical system in the image sensing plane,
   wherein the controller is configured to compute, using a first radius R1 as the pupil radius R of the projection optical system in the image sensing plane, a wavefront difference W1 that is a difference between a first wavefront of the projection optical system computed based on a first interference fringe formed on the image sensing plane when a position of the mirror relative to the projection optical system is in a first state and a second wavefront of the projection optical system computed based on a second interference fringe formed on the image sensing plane when the position of the mirror relative to the projection optical system is in a second state which is obtained by a movement of a movement amount $\Delta X$ from the position of the first state,
   to compute, using a second radius R2 that differs from the first radius R1 as the pupil radius R of the projection optical system in the image sensing plane, a wavefront difference W2 that is a difference between a third wavefront of the projection optical system computed based on the first interference fringe, and a fourth wavefront of the projection optical system computed based on the second interference fringe, and
   to compute the quotient $\Delta NA/\Delta R$ using the following equation:

$$\Delta NA/\Delta R = (W1-W2)/\{(R1-R2)\Delta X\}.$$

5. A device manufacturing method comprising the steps of:
   exposing a substrate coated with a photosensitive agent using an exposure apparatus configured to project a pattern of an original onto the substrate using a projection optical system to expose the photosensitive agent on the substrate; and developing the photosensitive agent, wherein the exposure apparatus comprises:

a mirror configured to reflect test light which passes through the projection optical system;

an interferometer unit which includes an image sensor and is configured to form an interference fringe on an image sensing plane of the image sensor by reference light and the test light reflected by the mirror; and a controller configured to control the interferometer unit, and compute a numerical aperture NA of the projection optical system based on the interference fringe captured by the image sensor, wherein the controller computes the numerical aperture NA of the projection optical system by multiplying a quotient $\Delta NA/\Delta R$ describing a change $\Delta NA$ in the numerical aperture NA of the projection optical system with respect to a change $\Delta R$ in pupil radius R of the projection optical system in the image sensing plane by the pupil radius R of the projection optical system in the image sensing plane, wherein the controller is configured to compute, using a first radius R1 as the pupil radius R of the projection optical system in the image sensing plane, a wavefront difference W1 that is a difference between a first wavefront of the projection optical system computed based on a first interference fringe formed on the image sensing plane when a position of the mirror relative to the projection optical system is in a first state and a second wavefront of the projection optical system computed based on a second interference fringe formed on the image sensing plane when the position of the mirror relative to the projection optical system is in a second state which is obtained by a movement of a movement amount $\Delta X$ from the position of the first state, to compute, using a second radius R2 that differs from the first radius R1 as the pupil radius R of the projection optical system in the image sensing plane, a wavefront difference W2 that is a difference between a third wavefront of the projection optical system computed based on the first interference fringe, and a fourth wavefront of the projection optical system computed based on the second interference fringe, and to compute the quotient $\Delta NA/\Delta R$ using the following equation:

$$\Delta NA/\Delta R=(W1-W2)/\{(R1-R2)\Delta X\}.$$

* * * * *